PLURAL-STAGE THERMOELECTRIC HEAT PUMP

Filed Jan. 4, 1960 2 Sheets-Sheet 1

INVENTORS
ROBERT S. LACKEY
WILLIAM L. WRIGHT
JACK D. MEESS

BY William J. Foley
ATTORNEY

INVENTORS
ROBERT S. LACKEY
WILLIAM L. WRIGHT
JACK D. MEESS

BY William J. Foley
ATTORNEY

United States Patent Office 2,978,875

Patented Apr. 11, 1961

2,978,875

PLURAL-STAGE THERMOELECTRIC HEAT PUMP

Robert S. Lackey, Pittsburgh, William L. Wright, Monroeville, and Jack D. Meess, Export, Pa., assignors to Westinghouse Electric Corporation, East Pittsburgh, Pa., a corporation of Pennsylvania Filed Jan. 4, 1960, Ser. No. 211

4 Claims. (Cl. 62—3)

This invention relates to thermoelectric heat pump apparatus and more particularly to plural-stage heat pumps for refrigeration applications.

A thermoelectric heat pump is a device utilizing the Peltier phenomenon of heat absorption and heat dissipation at junctions between bodies having different thermomotive properties, which phenomenon occurs when electric current is passed through the bodies. A number of junctions, or couples, are generally employed in a heat pump of this type, the couples being physically and electrically interconnected to form a thermoelectric "array." In refrigeration applications, such as that of a domestic refrigerator, the thermoelectric heat pump provides a silent, compact and generally service-free means for removing heat from an insulated enclosure and for dissipating this heat outside the enclosure.

Presently known and available materials for forming thermoelectric bodies are capable of efficient heat pumping with but a limited temperature differential between the cold junction side of the array and the hot junction side of the array. It has therefore become desirable to employ plural, or multi, stage heat pumps in which two or more thermoelectric arrays are pyramided, i.e., arranged in series thermo pumping relationship. For example, the freezing compartment of a domestic refrigerator should be maintained at a temperature of the order of 0 degrees F. Although operating conditions will vary, the heat dissipating structure of a heat pump employed to refrigerate this compartment may be required to operate at a temperature of the order of 140 degrees F. This temperature differential between the heat absorbing side of the pump and the heat dissipating side of the pump, of the order of 140 degrees F., is in excess of the temperature differential under which a single thermoelectric array made with existing materials is capable of operating efficiently. A two-stage heat pump, in which a first thermoelectric array operates over a differential of, say 45 degrees F. and in which a second thermoelectric array removes heat from the first array and operates with a temperature differential on the order of 95 degrees F., is capable of efficient performance for this application.

This invention deals with the structural, or physical, aspects of this type of plural-stage heat pump and the principal object of the invention is improvement in the performance and reliability of such heat pumps.

The plural-stage heat pump generally includes a heat absorbing structure, a heat dissipating structure and an intermediate heat transfer structure. A first-stage thermoelectric array removes heat from the heat absorbing structure and pumps this heat to the intermediate structure. A second-stage array pump heat from the intermediate structure into the heat dissipating structure. This invention provides a novel arrangement for these several components of the heat pump whereby they are reliably positioned and supported in proper operating relationship to one another. In accordance with this invention the heat dissipating structure of the heat pump is employed as the primary, or basic, structural member of the entire heat pump. Mounted on and supported by this heat dissipating structure are the other components of the heat pump, but certain of the components are mounted in an indirect manner, so as to achieve certain advantages not achieved with prior heat pump structures. Specifically, the heat absorbing structure and the first-stage thermoelectric array are mounted on and supported by the intermediate heat transfer structure, so that these three components are positively fixed in relation to one another. The intermediate heat transfer structure and the second-stage thermoelectric array are mounted on and supported by the heat dissipating structure, so that these three components are in positive fixed relationship to one another. Thus, while the heat absorbing structure is ultimately supported and carried by the heat dissipating structure, it is so carried through the intermediate heat transfer structure. The principal benefit achieved by this approach to heat pump structure design is the maintenance of a secure relationship between each component of the heat pump and those other components of the heat pump with which it thermally and structurally cooperates.

The detail aspects of the invention, as well as additional objects and advantages thereof will be made clear in the following detailed description of the invention in which reference is made to the accompanying drawings wherein.

Figures 1, 2, 5:
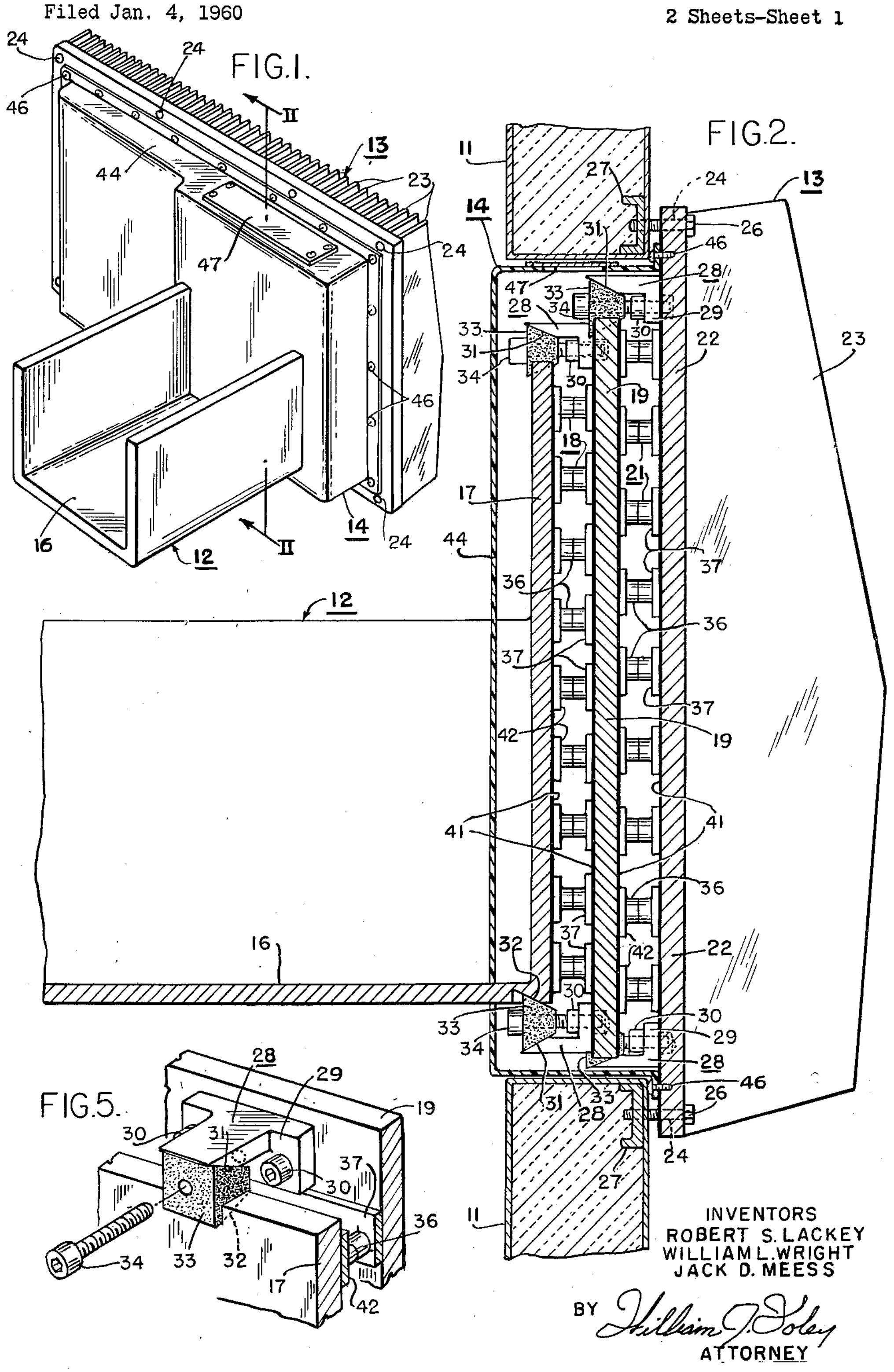
Fig. 1 is a perspective illustration of a thermoelectric heat pump utilizing this invention.
Fig. 2 is a vertical sectional view through a heat pump mounted in an insulated wall, the view being taken as indicated by the line II—II in Fig. 1.

The thermoelectric heat pump illustrated in Fig. 1 is suitable for refrigerating the low temperature, or freezing, compartment of a domestic refrigerator and is capable of maintaining such a compartment and the contents thereof at a temperature suitable for preserving frozen foods and for freezing water, say of the order of 0 degrees F. The heat pump is adapted to be mounted in an opening in an insulated wall 11 in such a manner that its heat absorbing structure 12 projects into the interior of the compartment to be cooled and its heat dissipating structure, indicated generally at 13, is disposed outside of the compartment for dissipating heat to the outside air, or other medium. (See Fig. 2.) The body, or intermediate, region 14 of the heat pump houses the thermoelectric components of the pump by which heat is transferred from the heat absorbing structure 12 to the heat dissipating structure 13. This body portion 14 is preferably shaped to conform to and plug the opening in the insulated wall 11 when the heat pump is installed as shown in Fig. 2.

The heat absorbing structure 12 of the heat pump includes a heat conducting channel 16 and a plate 17, which are formed of plate aluminum, or other good heat conducting material. A relatively thick plate of material is utilized in forming the heat absorbing structure 12 in order to minimize the resistance to heat flow from the insulated compartment to the body portion 14 of the heat pump. Heat absorbing plate 17 has a face portion thereof in heat transfer relationship with the cold junction face of a thermoelectric array 18, which constitutes the first stage of the heat pump. This first-stage array 18 has a face area which is substantially coextensive with the area of the face of the heat absorbing plate 17 with which it is associated.

Heat pumped by the first-stage array 18 is absorbed by an intermediate heat transfer structure in the form of a plate 19 which is preferably made from aluminum or other material having good heat conducting characteristics. The intermediate plate 19 is larger in face area than the heat absorbing plate 17 and the first-stage array 18 in order to distribute the heat conveyed thereto over the cold junction face of a second-stage array 21. This second-stage array 21 is in heat transfer relationship with the opposite face of the intermediate plate 19 and has a face area which is substantially coextensive with the face area of the intermediate plate. The opposite, or hot junction, face of the second-stage array 21 is disposed in heat transfer relationship with one face of a still larger plate 22 of heat conducting material, such as aluminum, which forms a part of the heat dissipating structure 13. In a heat pump intended to dissipate heat to the outside air it is desirable that the heat dissipating structure 13 also include a plurality of fins 23. These fins are secured in good thermal transfer relationship with the heat dissipating plate 22 for the purpose of increasing the surface area of the heat dissipating structure and thereby improving the transfer of heat to air flowing thereover.

Heat pump structures generally of the character described up to this point have been known in the past. The improvement to such structures which constitutes this invention deals principally with the manner in which the several components of the heat pump are structurally, or mechanically, connected to one another and supported in the wall structure of the cabinet with which the heat pump is used.

In accordance with this invention the plate 22 of the heat dissipating structure 12 is the principal, or basic, structural element of the heat pump and, in keeping with this purpose, is provided with a number of openings 24 along its edges for receiving a number of mounting bolts 26. The bolts 26 pass through plate 22 and are threadably received in suitable braces 27 disposed about the periphery of the opening in wall structure 11 for the purpose of holding the heat pump in place. The heat dissipating plate 22 also carries and supports the intermediate heat transfer plate 19, the latter being gripped at its edges by several support clamps 28 mounted on that face of the heat dissipating plate which faces inwardly of the heat pump body 14. The intermediate plate 19, in turn, supports the heat absorbing plate 17 which is gripped at its edges by additional support clamps 28 mounted on a face of the intermediate plate 19.

The support clamps 28, one of which is illustrated in an enlarged detail in Fig. 5, represent but one type of clamping or holding means suitable for the purpose of positioning plates 17, 19 and 22 with respect to one another. The clamps 28 are described here to illustrate the requirements of such clamping means in the heat pump structure of this invention.

It will be noted from the drawing that each support clamp comprises a bracket 29 which is secured, as by means of bolts 30, to the face of that plate of the heat exchanger from which another plate is to be supported. The bracket 29 of each clamp has an inclined surface 31 thereon which faces another inclined surface 32 provided by recessing a region of the edge of the plate which is to be supported. Cooperating with these inclined surfaces 31 and 32 is a wedge-shaped plug 33 formed of heat insulating material. Fabric reinforced resin plastic is particularly suitable for forming plugs 33 as it not only posseses good heat and electrical insulating characteristics but also possesses high strength. The plug 33 of each support clamp 28 is pressed between the inclined surfaces 31 and 32 by a bolt 34 passing through the plug and threadedly received in a tapped opening in the base of the clamp bracket 29.

There is at least one support clamp engaging each of the four side edges of the intermediate plate 19 and the heat absorbing plate 17. It can readily be appreciated that when the bolt 34 of each of the support clamps positioned around the edge of one of the plates 17 or 19 is tightened that plate is securely and positively clamped against the face of the thermoelectric array with which it is associated and is prevented from sliding, or shifting, laterally on the array face. It should also be apparent that by loosening certain of the support clamps 28 for any one plate and tightening an opposite support clamp it is possible to shift that plate laterally to align it with the face of the thermoelectric array and properly position that plate with respect to the other plates of the heat pump. As pointed out previously, other clamping means capable of providing a positive, yet adjustable, support for the plates 17 and 19 can be used.

Figures 3, 4:
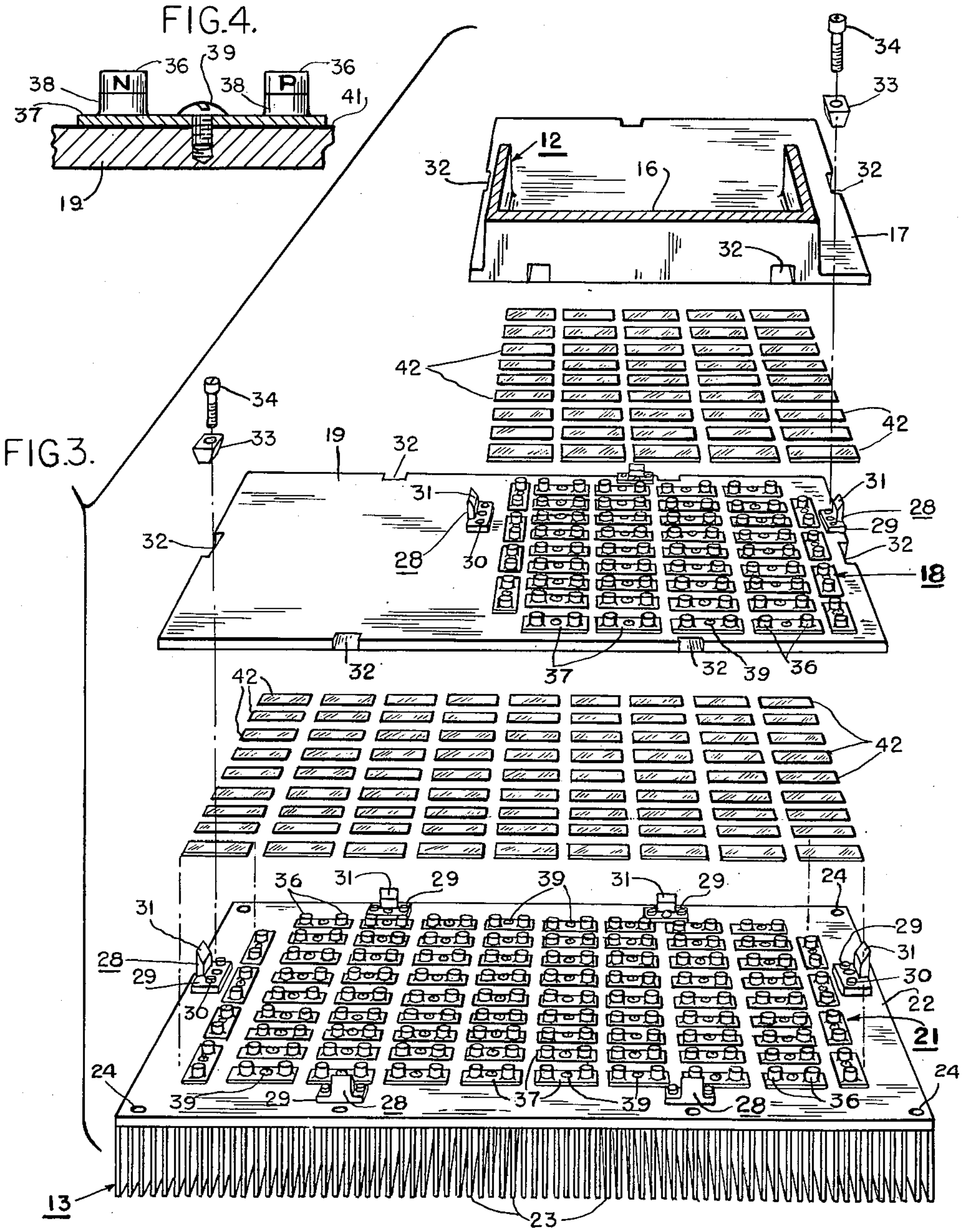
Fig. 3 is an exploded perspective view of the major components of the heat pump from which certain parts have been omitted to clarify the illustration.
Fig. 4 is a detail enlargement illustrating a mounting arrangement for one of the thermoelectric couples employed in the heat pump; and, Fig. 5 is an enlarged perspective illustration of a support clamp employed in the heat pump.

It is to be noted that the face areas of the plates 17, 19 and 22 are graduated, with the heat absorbing plate 17 having the smallest area of the three and the heat dissipating plate 22 having the largest area of the three. This can be considered, in a sense, as being conventional design practice with respect to plural-stage heat pumps. This size graduation is made necessary by the fact that the heat dissipated from the hot junction face of a thermoelectric array is considerably in excess of the heat absorbed at the cold junction face of the array. The additional heat emitted by the array and which must be pumped by succeeding array stages results from Joulean losses in the thermoelectric array, principally in the bodies of thermoelectric material employed therein. Thus, as is best illustrated in Fig. 3 of the drawing, the second-stage thermoelectric array 21 is composed of a larger number of thermoelectric bodies and junctions than the first-stage array 18 and consequently has a larger face area. The heat dissipating plate 22 is still larger in face area to provide more effective disposal of the heat pumped by the second-stage array 21, including the heat losses occurring in the second-stage array.

Note, however, the manner in which this invention contemplates utilizing this size graduation of the plates 17, 19 and 22 in the structural supporting arrangement for the heat absorbing plate 17 and the intermediate plate 19. The comparatively large face area of the intermediate plate 19 with respect to the area of the heat absorbing plate 17 enables several support clamps 28 to be mounted on one face of plate 19 in positions to engage the edges of the heat absorbing plate 17. Likewise, a peripheral region of the inner face of the heat dissipating plate 22 is available for mounting those support clamps 28 which engage the edges of the intermediate plate 19. Each of the plates 17 and 19 are, therefore, supported outside the regions of the themoelectric arrays and the supports do not interfere with or unduly complicate the structure of the arrays. Moreover, supporting plates 17 and 19 in this manner does not add to the overall size of the heat pump because the supporting means need not project beyond, or outwardly of, the planar extent of the heat dissipating plate 22, which determines the maximum width and height dimensions of the heat pump.

The employment of supporting means for plates 17 and 19 which compress the first-stage array 18 between the plates 17 and 19 and the second-stage array 21 between the plates 19 and 22 is particularly desirable to insure good heat transfer between the arrays and the several plates. The thermoelectric bodies employed in present day arrays are generally made of a frangible material such as, for example, bismuth telluride, and therefore should not be subjected to forces which tend to bend or twist the bodies. These bodies are, however, capable of withstanding mild compressive forces and the uniform application of such forces to the array assists in preventing the individual bodies and the couples of the thermoelectric arrays from shifting their positions under the influence of jarring forces applied to the heat pump or the cabinet structure with which it is associated.

The details of construction of the two thermoelectric arrays 18 and 21 are shown in Figs. 3 and 4 and it will be noted that they are conventional in most respects. Each array is made of a plurality of couples, one of which is illustrated in Fig. 4. Each couple comprises two bodies 36 formed from materials having different thermomotive properties. Materials such as antimony and bismuth, or P type and N type bismuth telluride, may be utilized in forming the thermoelectric bodies 36. The hot junction for each couple is formed of an electrically and heat conductive structure comprising a metallic strap 37 and a pair of heat conducting and electrically conductive metal plugs 38 having their ends joined respectively to the strap 37 and the thermoelectric bodies 36. Each couple is preferably secured to the plate which absorbs heat therefrom by means of a non-conductive fastener, such as a plastic screw 39. The several couples are preferably insulated from each other and also from the metal plates 19 and 22 by means of a thin layer of electrical insulation 41. The arrays are completed by conductive strips 42, each of which connects dissimilar thermoelectric bodies 36 of adjacent couples. The several connections in the arrays are preferably made in such a manner as to provide a minimum of resistance to flow of electricity and heat and should, therefore, be soldered or brazed. The thermoelectric bodies, the junction straps 37, and the conductive strips 42 form a series electric circuit for each of the arrays 18 and 21. Suitable electric conductors (not shown) are provided for conveying electric current through the arrays 18 and 21 in a direction to induce a cooling effect at connecting strips 42 and a warming effect at the junction straps 37.

As suggested by the manner in which the heat pump is illustrated in Fig. 3, the several couples of the two arrays 18 and 21 are preferably fastened to plates 19 and 22, respectively, by means of screws 39 prior to assembling the conducting strips 42 thereto. Upon completion of each of the arrays 18 and 21 the plates 17 and 19 are connected to each other and then to the heat dissipating plate 21 by means of the support clamps 28, described above.

The thermoelectric components of the heat pump are housed within a plastic or other heat insulating shell 44 which has an edge flange that is secured by means of screws 46 to the inner face of the heat dissipating plate 22. The space within casing 44 which is not occupied by the components of the thermoelectric arrays and the plates 17 and 19 are preferably filled with an insulating material to reduce the leakage of heat through the heat pump to the interior of the cabinet. For this purpose an upper region of the casing 44 may be provided with a removable closure 47 to permit access to the interior of the heat pump for adding insulation thereto.

From the foregoing it should be apparent that this invention provides a novel approach to the problem of supporting the several components of a plural-stage thermoelectric heat pump. All components of the heat pump are supported from the relatively heavy, large mass, heat dissipating plate 22. Individual clamping and supporting means are employed, however, for the components associated with the first-stage array 18 and the components associated with the second-stage array 21. In other words, a positive, but adjustable, position relationship is maintained between heat absorber plate 17, array 18 and the intermediate plate 19 which is independent of the second-stage array 21. An equally positive and independent relationship is maintained between the intermediate plate 19, array 21 and the heat dissipating plate 22.

While the invention has been shown in but one form it will be apparent to those skilled in the art that it is not so limited, but is susceptible of various changes and modifications without departing from the spirit thereof.

What is claimed is:

1. In a plural-stage, thermoelectric heat pump, the combination of a heat absorbing plate, an intermediate plate and a heat dissipating plate, said plates being of graduated face areas in the order named with the heat absorbing plate having the smallest area of the three, said plates being disposed in facing, parallel, spaced relationship, a first thermoelectric array disposed between said heat absorbing plate and said intermediate plate for pumping heat from the former to the latter, a second thermoelectric array disposed between said intermediate plate and said heat dissipating plate for pumping heat from the former to the latter, first means mechanically connecting said heat absorbing plate to said intermediate plate for compressing said first array between said last-named plates and for supporting said heat absorbing plate from said intermediate plate, and second means mechanically connecting said intermediate plate to said heat dissipating plate for compressing said second array between said last-named plates and for supporting said heat absorbing plate, said intermediate plate and said first array from said heat dissipating plate.

2. In a plural-stage, thermoelectric heat pump, the combination of a heat absorbing plate, an intermediate plate and a heat dissipating plate, said plates being of graduated face areas in the order named with the heat absorbing plate having the smallest area of the three, said plates being disposed in facing, parallel, spaced relationship, a first thermoelectric array disposed between said heat absorbing plate and said intermediate plate for pumping heat from the former to the latter, means supporting said array on one of said two last-named plates, the face area of said first array being substantially coextensive with the face area of said heat absorbing plate, a second thermoelectric array disposed between said intermediate plate and said heat dissipating plate for pumping heat from the former to the latter, means supporting said second array on one of said two last-named plates, said second array having a face area substantially coextensive with the area of said intermediate plate, first means mechanically connecting said heat absorbing plate to said intermediate plate for compressing said first array between said last-named plates and for supporting said heat absorbing plate from said intermediate plate, and second means mechanically connecting said intermediate plate to said heat dissipating plate for compressing said second array between said last-named plates and for supporting said heat absorbing plate, said intermediate plate and said first array from said heat dissipating plate.

3. In a plural-stage thermoelectric heat pump, the combination of a heat absorbing plate, an intermediate plate and a heat dissipating plate, said plates being of graduated face areas in the order named with the heat absorbing plate having the smallest area of the three, said plates being disposed in facing, parallel, spaced relationship, a first thermoelectric array disposed between said heat absorbing plate and said intermediate plate for pumping heat from the former to the latter, means supporting said array on one of said two last-named plates, the face area of said first array being substantially coextensive with the face area of said heat absorbing plate, a second thermoelectric array disposed between said intermediate plate and said heat dissipating plate for pumping heat from the former to the latter, means supporting said second array on one of said two last-named plates, said second array having a face area substantially coextensive with the area of said intermediate plate, support means carried by said intermediate plate and engaging edge portions of said heat absorbing plate for compressing said first array between said last-named plates and for supporting said heat absorbing plate from said intermediate plate, and support means carried by said heat dissipating plate and engaging edge portions of said intermediate plate for compressing said second array between said last-named plates and for supporting said heat absorbing plate, said intermediate plate and said first array from said heat dissipating plate.

4. In a plural-stage thermoelectric heat pump, the combination of a heat absorbing plate, an intermediate plate and a heat dissipating plate, said plates being of graduated face areas in the order named with the heat absorbing plate having the smallest area of the three, said plates being disposed in facing, parallel, spaced relationship, a first thermoelectric array disposed between said heat absorbing plate and said intermediate plate for pumping heat from the former to the latter, the face area of said first array being substantially coextensive with the face area of said heat absorbing plate, a second thermoelectric array disposed between said intermediate plate and said heat dissipating plate for pumping heat from the former to the latter, said second array having a face area substantially coextensive with the area of said intermediate plate, first support means carried by said intermediate plate and engaging edge portions of said heat absorbing plate for compressing said first array between the two last-named plates and for supporting said heat absorbing plate from said intermediate plate, and second support means carried by said heat dissipating plate and engaging edge portions of said intermediate plate for compressing said second array between the two last-named plates and for supporting said heat absorbing plate, said intermediate plate and said first array from said heat dissipating plate.

References Cited in the file of this patent

UNITED STATES PATENTS

| | | |
|---|---|---|
| 2,844,638 | Lindenblad | July 22, 1958 |
| 2,884,762 | Lindenblad | May 5, 1959 |